United States Patent [19]

Sibley

[11] 4,090,173
[45] May 16, 1978

[54] VITAL DIGITAL COMMUNICATION SYSTEM

[75] Inventor: Henry C. Sibley, Adams Basin, N.Y.

[73] Assignee: General Signal Corporation, Rochester, N.Y.

[21] Appl. No.: 751,505

[22] Filed: Dec. 17, 1976

[51] Int. Cl.² ............................................. G06F 11/08
[52] U.S. Cl. ................. 340/146.1 BA; 340/146.1 AB
[58] Field of Search ............ 340/146.1 BA, 146.1 AB

[56] References Cited

U.S. PATENT DOCUMENTS

| | | | |
|---|---|---|---|
| 3,427,585 | 2/1969 | Milford | 340/146.1 BA |
| 3,461,238 | 8/1969 | Van Duuren et al. | 340/146.1 BA |
| 3,551,885 | 12/1970 | Henzel | 340/146.1 BA |
| 3,624,603 | 11/1971 | Delcomyn | 340/146.1 BA |
| 3,934,131 | 1/1976 | Perschy | 340/146.1 BA |
| 3,978,449 | 8/1976 | Sanders et al. | 340/146.1 BA |
| 4,019,172 | 4/1977 | Srodes | 340/146.1 BA |

*Primary Examiner*—Charles E. Atkinson
*Attorney, Agent, or Firm*—Pollock, Vande Sande & Priddy

[57] ABSTRACT

An all-digital communication system is arranged to exhibit fail-safe qualities. Each message includes a pair of words, each word separated from every other word by framing information in the form of two bits, either 1/0 or 0/1. Each word in the message is arranged to exhibit a constant ratio of 1's to 0's, so that more than a single change in any bit location is needed to change from one valid message word to another. The second word in each message is the complement of the first. Two decoders are disclosed, a hard-wired embodiment and an embodiment employing a microprocessor. In the hard-wired embodiment, straightforward decoding is employed to determine the apparent message, and the apparent message is encoded to generate a locally generated message which is then compared, bit by bit, with the received message employing vital logic techniques. Assuming each of the received and locally generated bits compare, the message is validated.

In the microprocessor embodiment, decoding of each word is accomplished by a table. Several checks are run to determine that the microprocessor is operating properly. The checks if successfully completed, produce a check word, which is not stored in the machine. The check word generated by decoding of the second word of a message should be complement of the first check word. External hardware determines the existence of each check word, in sequence, and allows the decoded microprocessor output to be effective.

18 Claims, 18 Drawing Figures

TYPICAL MESSAGE

RECEIVING CLOCK

MESSAGE DECODER

VITAL COMPARATOR STAGE

VITAL DRIVERS

FIG 7A VITAL AND GATE

TUNED VITAL DRIVER

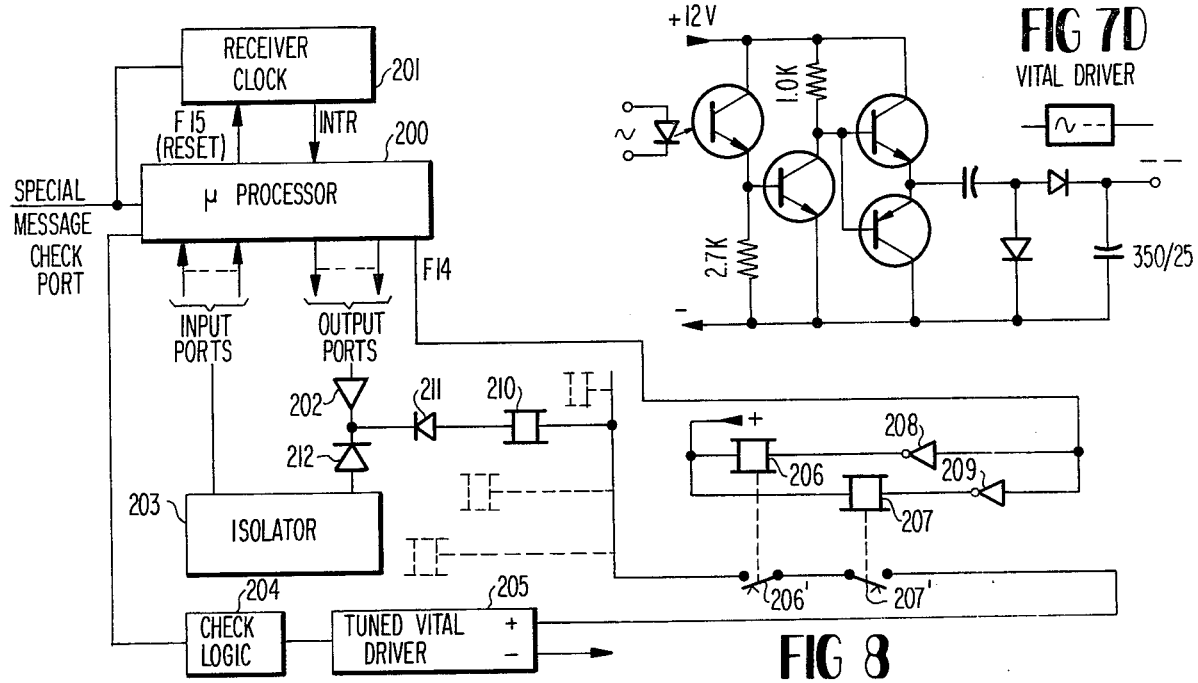
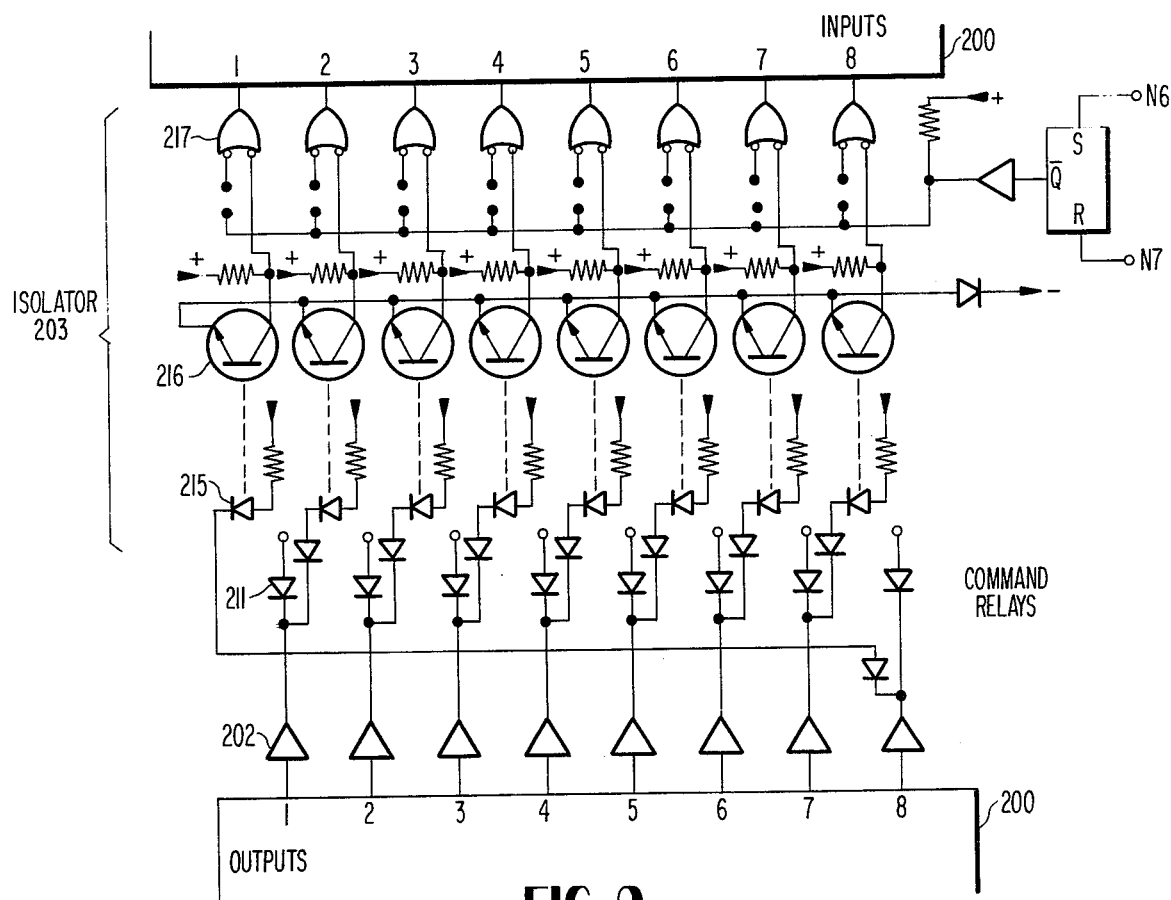
FIG 8
FIG 9

VITAL DIGITAL COMMUNICATION SYSTEM

BACKGROUND OF THE INVENTION

Communication is a basic function in which intelligence is transmitted from the transmitting location to a receiving location. Specific implementations of this function are many and varied depending upon the particular needs and rate of information transmission that is desired. One of the many trade-offs that can be made in designing communication apparatus is a function of the error rate and simply recognizes that the higher the allowable error rate the simpler the apparatus and conversely, lowering the error rate generally requires further complexity. A further constraint that is required in some applications is that the apparatus must be fail-safe, that is, the presence of a failure in the functioning of any of the components in the system must not be capable of bringing about a condition that is more dangerous than the condition that would have existed had the component not failed. For example, in a railroad application, wherein allowable speed information is the intelligence to be communicated, a communication failure should not allow a restrictive speed indication to be interpreted by a receiving apparatus as an indication of a higher allowable speed.

Apparatus of this sort has, in the past, employed analog techniques, and more particularly, has employed a so-called rate coding technique wherein the information takes the form of a tone or frequency modulated onto a carrier.

With the advent of small, low-cost and low-power-drain digital integrated circuits, there is a desire to employ these components in a communication system, and more particularly, in a fail-safe communication system. The prior art exhibits a number of digital communication systems having varying bit error rates. However, there are few, if any, digital communication systems which can be regarded as fail-safe. It is therefore one object of the present invention to provide a vital digital communication system.

It is another object of the invention to provide such a system wherein the digital logic, hard-wired or microprocessor provided, is checked by vital circuits before the output is allowed.

It is another object of the invention to provide a system with the foregoing features which will not produce an erroneous output from the decoder regardless of any failure, except in a vanishingly small number of unlikely situations.

SUMMARY OF THE INVENTION

These and other objects of the invention are met by providing a vital digital communication system having an encoder at a transmitting location and having a decoder at a receiving location. The encoder and decoder are arranged to communicate via a vocabulary of predetermined messages. Each message is comprised of a pair of words, each of which is further comprised of a particular bit pattern. A first word, for any message, has a constant ratio of 1's to 0's and the second word is the complement of the first. These words are separated by framing bits of a predetermined bit pattern. In one embodiment of the invention, the framing bits comprise two bits, and the pattern is either 1/0 or 0/1.

By transmitting, in a serial stream, a message comprising a word and its complement, the apparatus in that serial stream is exercised in order to uncover any failures in which a component sticks at one voltage level or another. By employing a constant ratio of 1's to 0's, the system prevents the change in a single bit location from effectively altering a message.

Two different decoders are disclosed. One preferred embodiment is a hard-wired decoder in which the apparent message is decoded from the received message by straightforward digital logic. However, before accepting the apparent message as the actual message, the apparent message is employed to encode a locally generated message which is then compared, bit for bit, with the received message. Only if this check indicates that the locally generated message is identical to the received message is the apparent message accepted as the actual message.

The second embodiment of the decoder employs a microprocessor which is arranged to decode each message word by a table look-up. To determine if the microprocessor is operating properly, a number of check procedures are carried out. A predetermined bit pattern is provided to the microprocessor output ports, which are wired to the input ports through a buffer in such a way that output bit position 1 is wired to input bit position 2. The predetermined bit pattern is cycled through the microprocessor until it reaches its initial position. Presence of the bit pattern in its initial position and the number of cycles required to achieve this condition are one component of a check procedure. The number of cycles are arithmetically added to an arithmetically modified version of the received message word. The result of other checks is used as an address into a table to obtain a further quantity which is again added to the result of the previous operations. The final result should be a predetermined bit pattern which, since it is not stored in the microprocessor, can only be generated by correct operation or a highly unlikely sequence of failures. External logic determines the presence of the check word. Reception of the next message word results in a second check word which should be the complement of the first check word. If both check words are produced in sequence by the microprocessor, the decoded output is validated and allowed to become effective.

BRIEF DESCRIPTION OF THE DRAWINGS

The present invention will now be disclosed in a fashion to enable any person skilled in the art to make and use the same, in conjunction with the attached drawings in which:

FIGS. 4A, 4B, 5A, 5B, 6, 7A, 7B, 7C and 7D are schematic diagrams for components shown in FIG. 3;

FIG. 8 is a block diagram of the microprocessor decoder embodiment;

FIGS. 9 and 10 are schematic diagrams of components shown in block form in FIG. 8; and, FIGS. 11A and 11B illustrate the routines employed by the microprocessor.

DETAILED DESCRIPTION OF THE INVENTION

Figure 1A:
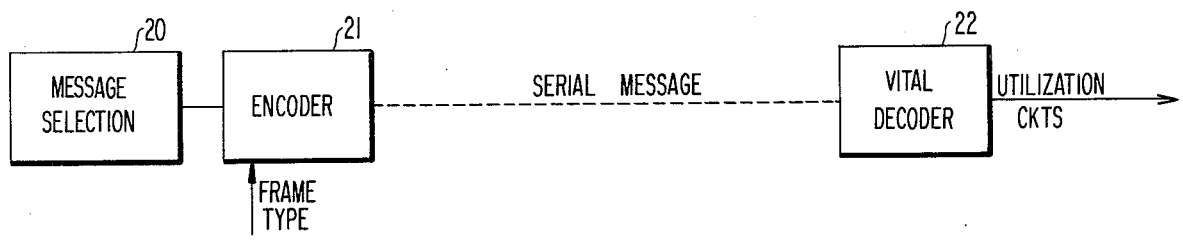
FIG. 1A is a block diagram of a typical message system.
Figure 1B:
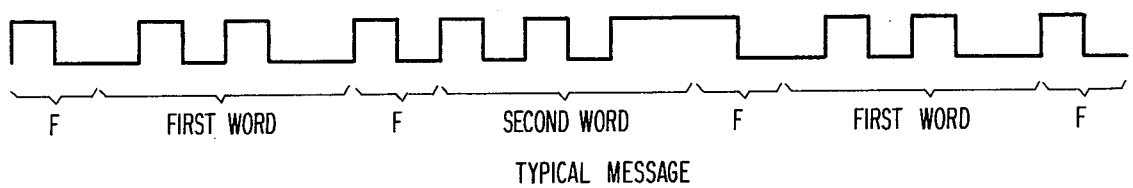
FIG. 1B is an illustration of a typical message in accordance with the invention.

FIG. 1A shows a typical digital communications system, in block diagram form. A message selection device 20, responsive to the selection of a particular message, of a vocabulary of possible messages, provides a suitable signal to an encoder 21. Encoder 21, in addition to receiving the foregoing information, also is apprised of the frame type that is to be employed. In the preferred embodiment, framing information includes a pair of bit positions, and the decoding apparatus can respond to framing information in the form of 1, 0 or 0, 1. Therefore, the encoder 21 must be apprised of which type of framing information that is to be transmitted. The encoder then generates the message which has been selected and transmits it in serial form, to the vital decoder 22. When the message is decoded, and assuming that the decoder 22 recognizes a valid message, it provides a signal to the utilization circuits. FIG. 1A omits, of course, modulators, demodulators and a particular communication link employed between the encoder and decoder. One of the advantages of the invention is that the particular forms of modulation and the equipment employed to perform that function, as well as the particular carrier frequency employed play no part in the safety of the message transmission function. In the railroad application mentioned above, the communication link may, as is conventional in the art, include the track rails themselves. FIG. 1B illustrates a typical message. As shown, a typical message includes a pair of words, a first word and a second word, with the second word being the complement of the first. Furthermore, the ratio of marks to spaces (or 1's to 0's) in the first word (and, of course, in the second) is a constant. While in any particular implementation the ratio would be fixed, it is within the scope of the invention that various ratios can be employed. The message illustrated in FIG. 1B employs a 2 marks or ones out of 6 spaces or zeros. FIG. 1B also illustrates that the particular message illustrated employs the framing sequence 1, 0 and this sequence separates each of the different words. As shown in FIG. 1B, the message thus comprises a framing pattern, a first word, a second framing pattern identical to the first, and a second word which is the complement of the first. FIG. 1B further shows that following transmission of a message, the same message is repeated again, and so on.

Particular advantages accrue from this particular message arrangement. In the first place, since the second word is the complement of the first, and the message is sent over a serial data link, the components in the link must function properly in order for both the first and second words to be transmitted. In addition, because of the constant ratio of marks to spaces (or 1's to 0's) the change in a single bit location will not result in interpretation of a valid word, as should be apparent to those skilled in the art.

Figure 2:
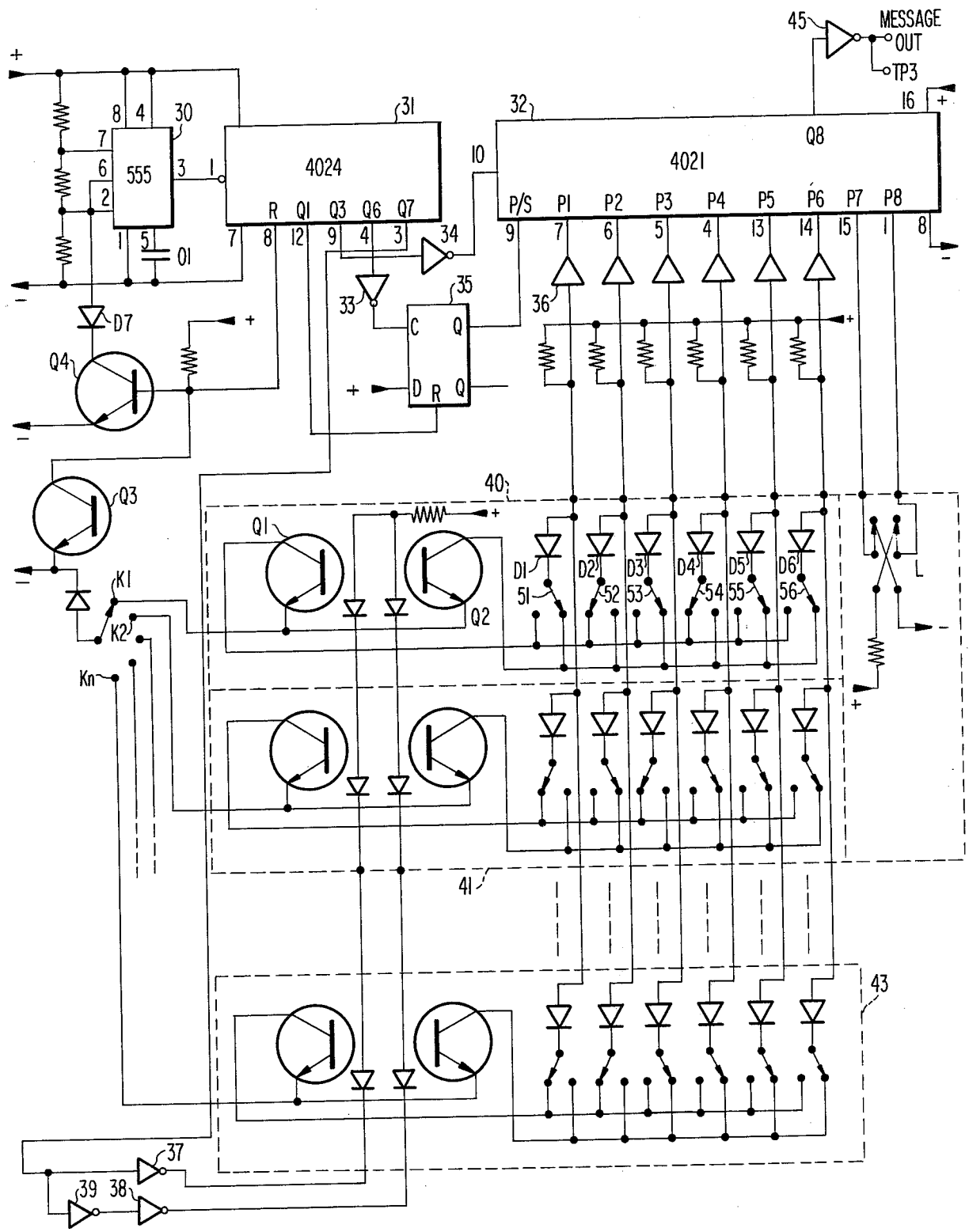
FIG. 2 is a schematic diagram for a suitable encoder.

To see how a message is generated, reference is now made to FIG. 2, which illustrates a preferred embodiment of the encoder 21, and the manner in which it cooperates with a message selecting device. FIG. 2 illustrates a timing circuit 30 connected to a suitable power supply, and further connected to resistors and capacitors to establish a desired timing rate. The output of the timer 30 is coupled to the clocking input of a counter 31. A shift register 32 has an output through an inverter 45 to a terminal labeled MESSAGE OUT, which comprises the output of the encoder 21. During the course of the operation of the apparatus illustrated in FIG. 2, each different message word, with its associated framing bits, will be input to the shift register, in parallel, and the word will then be shifted out of the shift register through the inverter 45, in response to timing signals from the counter 31. The shift register 32 has eight parallel inputs which comprise an input for each bit in either of the words as well as two inputs for the framing pattern. Each word-bit input is provided through an amplifier 36 whose input is coupled to a positive source of potential through a resistor. The input to each of the amplifiers 36 is also coupled to a series of diodes, each in a separate code panel such as code panel 40, 41 and 43. Each code panel corresponds to a different message word, and each is capable of generating both the word and its complement. Each diode in each code panel is illustrated as connected to one pole of a switch, the other two poles of which are respectively connected to collectors of two different transistors Q1 and Q2. This arrangement allows the word generated by each panel to be varied by positioning the switches. In practical operation the switches could be replaced by permanent wiring. Each of the transistors Q1 and Q2 are optically coupled through two different diodes to a source of positive potential. The emitters of the transistors Q1 and Q2 are connected in common to one pole K1, for example, of a rotary switch K, having as many poles as there are different messages. The rotary switch K is one example of a message selector 20, but of course, other examples will occur to those skilled in the art, such as relay contacts, etc. The common pole of the rotary switch K is connected to a negative source of potential. The cathodes of the diodes optically coupled to the transistors Q1 and Q2 are connected respectively to the outputs of inverters 37 and 38 which are controlled in turn by the Q7 output of counter 31. Thus, when the output Q7 is high, for example, either Q1 or Q2 is enabled to load either the word or its complement, and conversely, when the output of Q7 is low, the other diode enables the other of transistor Q1 and Q2 to load the other word of the two word message.

The counter 31 has a reset input coupled to the collector of a transistor Q3 which is optically coupled to a diode connected within the common terminal of rotary switch K and a source of negative potential. The base of a transistor Q4 is also connected to the collector of transistor Q3 and its collector is connected to the cathode of a diode D7 whose anode is connected to terminal 6 of the timer 30. Counter 31 has 7 output stages; output stage 1 is coupled to the reset input of a flip-flop 35 whose Q output is connected to the parallel input enable terminal P/S of the shift register 32. The D input to flop-flop 35 is connected to a source of positive potential and the C input is connected to the output of inverter 33 whose input is connected to the output of the sixth stage of counter 31. The third stage of counter 31 is connected to the input of inverter 34 whose output is coupled to the timing input to the shift register 32. The seventh stage of counter 31 is coupled to the inputs of inverters 37 and 39. The output of inverter 37 is coupled to the cathode of a diode in a serial string of diodes, one for each code panel, the furthest-most anode is coupled to a positive source of potential through a resistor. The output of inverter 39 is coupled to the input of an inverter 38 whose output is connected to the other serial string of optically coupling diodes, the anode of the furthest of which is also connected to a positive source of potential through the same resistor. A four-pole double throw switch L couples a source of positive potential through a resistor, and a source of negative potential to the framing input locations of the shift register 32. In the condition shown in the drawing, input P8 of the shift register 32 has a positive potential coupled thereto, and input P7 has a low or negative potential coupled thereto, thus providing the framing bit pattern 1, 0. By reversing the condition of switch L, the framing pattern 0, 1 is generated. Use of the switch allows the frame bits to be changed from 1, 0 to 0, 1 by reversing the switch position. It may be desirable to make the frame bits permanently of one type or the other by replacing this switch with permanent wiring or the like.

In operation, the particular message to be transmitted is first selected by appropriately positioning the moveable contact of rotary switch K to one of its positions, K1–K$n$. This provides a current path from the positive source of potential through the diodes D1 through D6, in code panel 40 (or corresponding diodes in other code panels) through transistor Q1 or Q2, then through the contact K1 and the moveable arm of the rotary switch K to a negative source of potential. Only one of the transistors Q1 or Q2 will be conductive, as determined by the potential at the output of inverter 37 and 38. For example, when the output of inverter 37 is low, (the output of inverter 38 will correspondingly be high and transistor Q1 will be conductive and transistor Q2 non-conductive). Correspondingly, when the output of inverter 38 is low, transistor Q2 will be conductive and transistor Q1 non-conductive. If we assume that transistor Q1 is conductive, when the inputs P1 through P6 take the following form, high, low, high, low, high, high; corresponding to 1, 0, 1, 0, 1, 1. At the same time, the framing inputs, at P7, P8 are subject to 0, 1. At this time, however, shift register 32 does not respond to the inputs on P1–P8 since the input to the P/S terminal is not at a high potential.

As the timing circuit 30 provides timing pulses to the counter 31, it begins to count. On the first transition of the output Q1, flip-flop 35 is reset, if it has not already been reset, which insures that P/S input terminal of shift register 32 is low, preventing the shift register from responding to its parallel inputs. As transitions occur at Q3, shift register 32 is cycled, but since, in the example being explained, no meaningful information has been loaded, the output pulses do not correspond to any of the messages. As counter 31 continues to count, the transition produced at the output Q6 serves to set flip-flop 35 through the inverter 33. At this time, shift register 32 is enabled to respond to its parallel inputs, and the previously recited pattern is stored in the shift register. On the next immediate transition at Q1, flip-flop 35 is reset, thus disabling the inputs P1–P8. With the shift register now loaded, transitions at the output Q3 through inverter 34, shift the stored pattern out through inverter 45. Thus, the stored pattern 1, 0, 1, 0, 1, 1 corresponds to the word 0, 1, 0, 1, 0, 0, as shown in FIG. 1B. After the word, and the framing bits stored in the shift register 32 are completely shifted out, a transition is produced at the output Q6. This has the effect of again setting flip-flop 35 to again load the shift register 32. However, between the time the shift register was first set, and the time that a transition is produced at Q6, a condition at the output Q7 has changed so that now Q2 is conductive and Q1 is non-conductive. As a result, the inputs P1 through P6 receive a complement of the pattern that was previously loaded, whereas the inputs P7 and P8 receive the identical pattern. On the next transition, at the output of Q1, flip-flop 35 is again reset to disable the shift register parallel inputs. Now, as transitions are produced at Q3, the new pattern is shifted out of the shift register 32. During the time that a pattern is being shifted out of shift register 32, a transition occurs at the output of Q7 to change the pattern available at the inputs to the shift register 32. However, until the proper transition is produced at the output of Q6, which occurs just after shifting out of the last bit, these new inputs have no effect on the shift register. Just after shifting out the last bit, however, the new pattern is again stored in the shift register 32 for similar operation.

During normal operation, one or the other of the transistors Q1 or Q2, or one of the other corresponding transistors in other code panels, is always energized and thus a flow of current is always provided through the diode optically coupled to transistor Q3. As a result, transistor Q3 is normally on and it normally provides a low voltage to the resetting input of counter 51. In a similar fashion, transistor Q4 is normally cut off. However, in order to save time, when there is a transition between messages, the transistors Q3 and Q4 are provided to respond essentially simultaneously with the transition in the message selection. As explained above, the message to be sent is selected by engaging one of the contacts K1 through K$n$ by rotary switch K. Thus, changing a message to be transmitted requires breaking the circuit to one of these contacts and making a circuit to another. As a result of breaking the circuit, the flow the current through the diode optically coupled to transistor Q3 will be interrupted. The voltage at the collector of transistor Q3 rises providing a resetting input for the counter 31. At the same time, the same voltage transition enables transition of transistor Q4, coupling a low voltage transition to the input of the timer 30 for resetting of that as well. As a result, when the selected message changes, resetting counter 31 begins its operation again by loading the newly selected message into the shift register and shifting the same out, as explained above.

Figure 3:
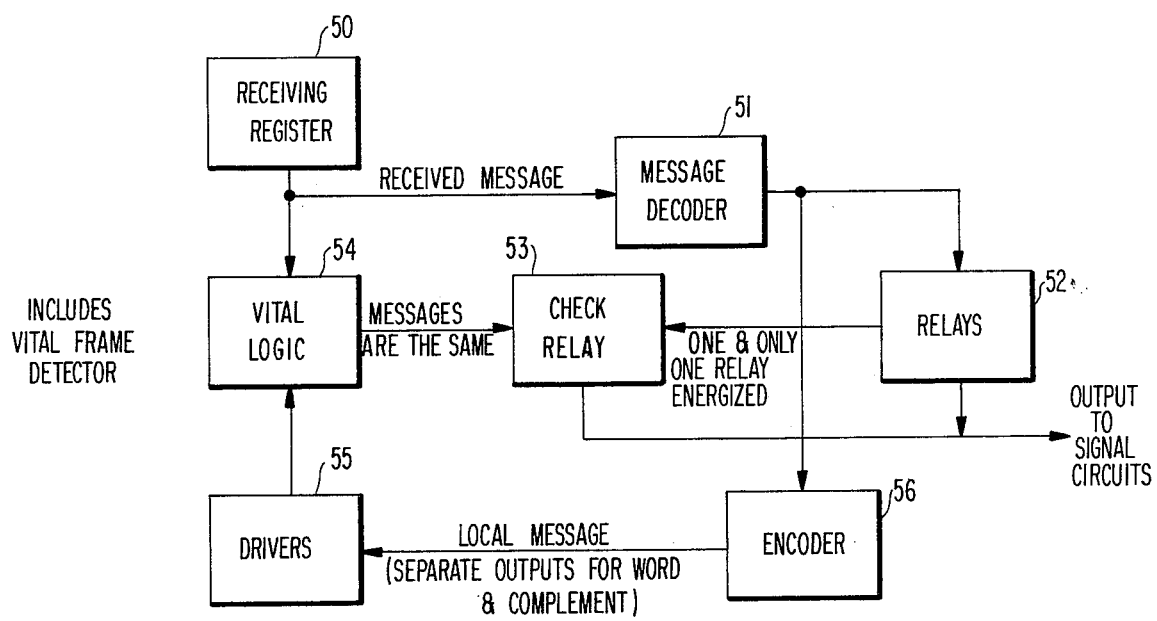
FIG. 3 is a block diagram for the hard-wired embodiment of a decoder.

In order to provide vital operation of the communication system, the decoder arrangement must be arranged so that it is fail-safe, i.e., failure of a component should not result in the erroneous reception of a more favorable indication than that which is actually transmitted. Furtermore, components which have failed should readily provide an indication that failure has occurred. An embodiment of a vital decoder meeting the foregoing requirements is illustrated in FIG. 3. As shown there, it comprises a receiving register 50 for receiving the serial message and providing a message to a message decoder 51 and vital logic 54. The message decoder 51, in turn, provides the decoded message to a plurality of relays 52 as well as to an encoder 56. The encoder 56, through drivers 55, provides a locally generated message to the logic 54. If this compares favorably with the message provided by the receiving register 50, a check relay 53 is energized to indicate that the message apparently received at the receiving register 50 has been validated. After a further check to insure that only one of the relays 52 have been energized, the outputs are made available to a utilization circuit. This arrangement can be termed a select/check decoder. Neither the message decoder itself, nor any of the other elements 52, 53, 55 or 56 are vital, or fail-safe. However, the vital logic 54 provides the protection against false operation. More particularly, if a message has been corrupted and the decoder erroneously decoded it as a valid message, then the error would be detected in the vital logic by determining that the locally generated message did not match the pattern received. Similarly, if the decoder 51 erroneously decodes one message as another, this type of failure would also be detected in the vital logic inasmuch as the received bit pattern will not match the bit pattern of the locally generated message. The receiving register 50 is shown in more detail in FIG. 4A.

The receiving register includes a shift register 60 provided with clocking information from a local clock as well as a message input to terminal D. Terminal D is coupled, in common, to a flip-flop 61 whose Q output is coupled to the input of flip-flop 62 whose Q output is fed back and resets flip-flop 61 and also provides bit sync information. An alternating signal is provided to the other input of flip-flop 62. The other input of flip-flop 61 is connected to a positive potential. Shift register 60 is 10 stages long, corresponding to the message word length plus a pair of framing bits, front and back. The Q10 output is provided as an input to a NAND gate 67. The Q9 output is provided as an input to NAND gate 66, the other input to which is provided by Q1. The other input to NAND gate 67 is provided by Q2. The outputs of NAND gates 67 and 66 are applied to OR gate 68, which provides an input to another NAND gate 69. The other input to NAND gate 69 is provided by a local clock generating the bit rate. Gates 66–69 form a frame detector to determine when bits 3 through 9 include a message word. The output of NAND gate 67 is provided as an input to an inverter 70, which provides an input to a NAND gate 71 whose output provides an input to an inverter 72 which is provided as the setting input to register 63. The output of NAND gate 66 is provided as an input to inverter 73 whose output is coupled to the C input of flip-flop 74, the D input being coupled to a source of positive potential. The resetting input to flip-flop 74 is provided by the bit rate derived from the local clock. Finally, inverter 75 supplies a reset signal to the register 63 derived from the local clock and identified as MESSAGE STORE RESET. The register 63 comprises an R-S flip-flop for each bit in a word.

In operation, the message is serially received and serially loaded into the shift register 60. The frame detector determines when the message bits are contained in shift register stages Q3–Q9, and at this time, the register 63 is enabled by the output of inverter 72. Because the framing bits, coupled before and after a word are identical and because every second word is a complement of the preceding word, the only bit positions separated by 8 intervening bit positions which are invariably the same are either of the framing bits. Thus, gate 66 detects simultaneous ones in the ninth and first bit positions of shift register 60. NAND gate 66 has a low output when, and only when, the first framing bit in each pair is located in the ninth and first stages of the shift register (assuming a 1, 0 framing pattern). Likewise, NAND gate 67 has only a low output when the leading frame bits are in the tenth and second stages of the register, and this occurs, of course, when the six word bits occupy stages 3-9, connected to corresponding stages in the register 63. Thus, at this time, the output of the inverter 70 enables NAND gate 71 to provide, through inverter 72, an input to the enabling input for the register 63. At this time, therefore, the six bits in the first or second word of the message are stored in the register 63. At the same instant, the frame bit stores 64 and 65, look at the second bit in the framing bit pattern which should be a 0. If they are, the $\overline{Q}$ outputs may be used to control corresponding stages in the driver 76, as explained below. Thus, each time a complete word (or half a message) is received, it is properly stored in the register 63. The register 63, through the driver stages 76 provides outputs to both the message decoder 51 and the vital logic 54.

The receiving clock (FIG. 4B) operates via a timer and employs the BIT SYNC and FRAME SYNC signals from the receiving register (FIG. 4A) and generates the signals BIT RATE, SAMPLE GATE and MESSAGE STORE RESET. As shown in FIG. 4B, the receiving clock is driven by a timer, or oscillator 101. The alternating current signal used in several circuits is derived from an inverter 114. The output of the timer also clocks counter 102, which, in turn, clocks another counter 103 and resets the flip-flop 109. One of the outputs of the counter 103 provides an input to the flip-flop 109 clocking the flip-flop from the Q4 output of counter 103 and resetting it from the output of counter 102 to generate a narrow pulse at approximately the middle of a bit time. This pulse, called SAMPLE GATE is provided through inverter 111, and is employed to clock the incoming messages to shift register 60 (see FIG. 4A).

The Q5 output of counter 103, coupled via inverter 105 to an inverting input of an OR gate 106, whose output is coupled as the setting input to a flip-flop 107. The other input to OR gate 106 also through an inverting input, is provided by inverter 104 which receives an input, the signal BIT SYNC, (generated by flip-flops 61 and 62 in FIG. 4A). The same input is provided to reset counter 102. The Q output of flip-flop 107 is coupled through inverter 110 and comprises the signal termed BIT RATE (provided as an input to AND gate 69 and flip-flop 74 in FIG. 4A). The flip-flops 61 and 62 detect a transition in the message and this transition is used to synchronize counter 102 and flip-flop 107. The Q output of flip-flop 107 provides the clocking input to a counter 108 and a resetting input to counter 103. The signal FRAME SYNC is provided to reset counter 108 and is derived from flip-flop 74 (see FIG. 4A). The $\overline{Q}_1$ output of counter 108 is provided as one input to an AND gate 112, whose other input is provided by the $\overline{Q}_n$ output of counter 108. The output of NAND gate 112 is provided, through inverter 113, and forms the MESSAGE STORE RESET signal, coupled to the invert of inverter 75 (see FIG. 4A).

In operation, the frequency of oscillator 101 and the counters used to generate the sample rate and bit rate signal are selected appropriately to the bit rate employed in the system. The BIT SYNC signal serves to reset the clock in accordance with observed signal synchronization. As a word is shifted into shift register 60 NAND gate 66 responds to the leading frame bit in the ninth stage and the corresponding frame bit in the first stage; that is, one bit time before the new word and its associated framing bits completely fill the shift register 60. The output from NAND gate 66 coupled through inverter 73, serves to set flip-flop 74 providing the frame sync signal. The frame sync signal resets counter 108 and thus directly generates the message store reset. As a result, the preceding word, which had been stored in register 63 is, one bit time before the following word completely fills shift register 60, removed from the register 63. On the next bit time, NAND gate 67 responds to the first framing bit in the tenth and second stages of shift register 60 to enable the register 63 to respond to the newly-received word.

Figure 4A:
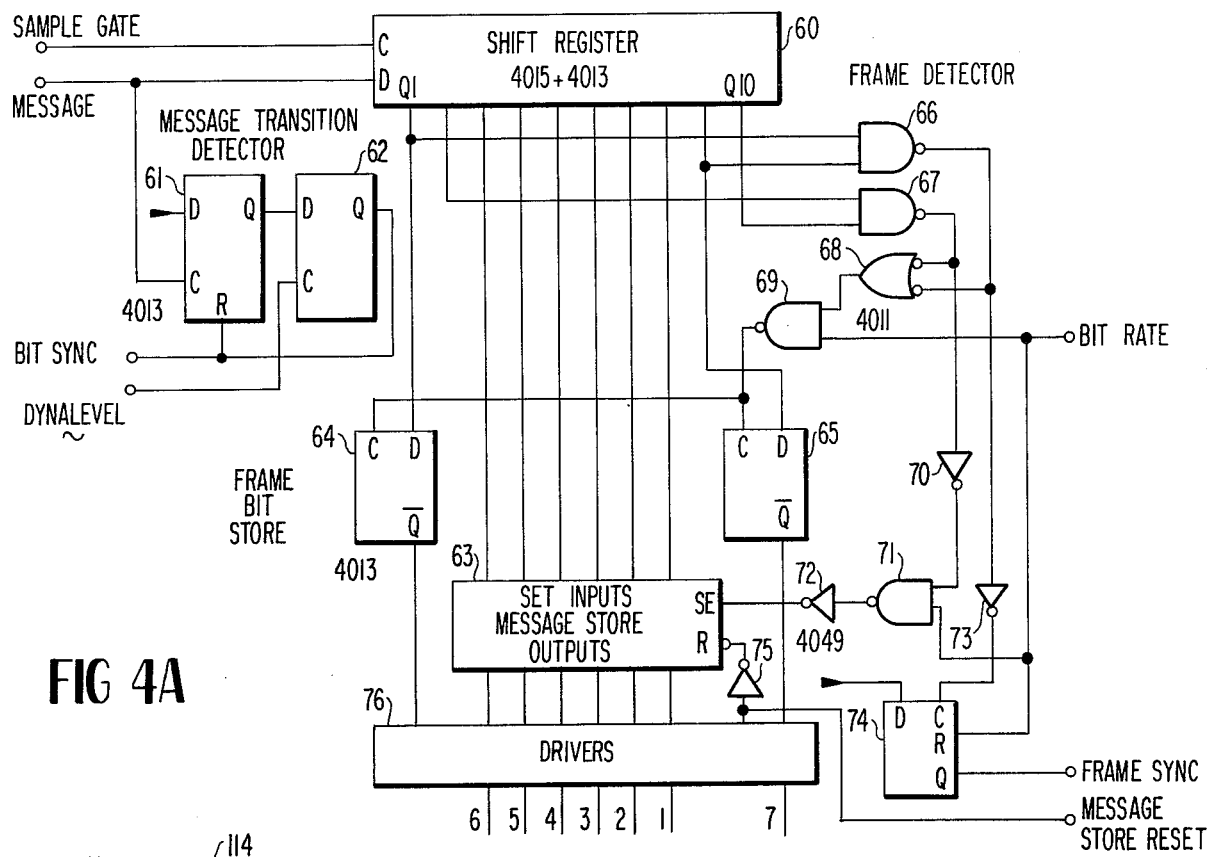
Figure 4B:
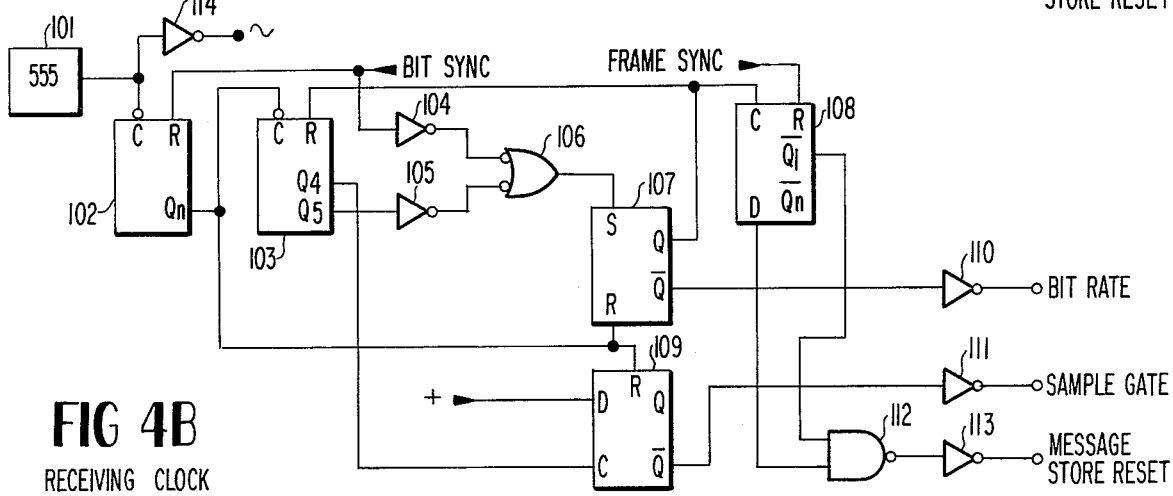
Figure 5A:
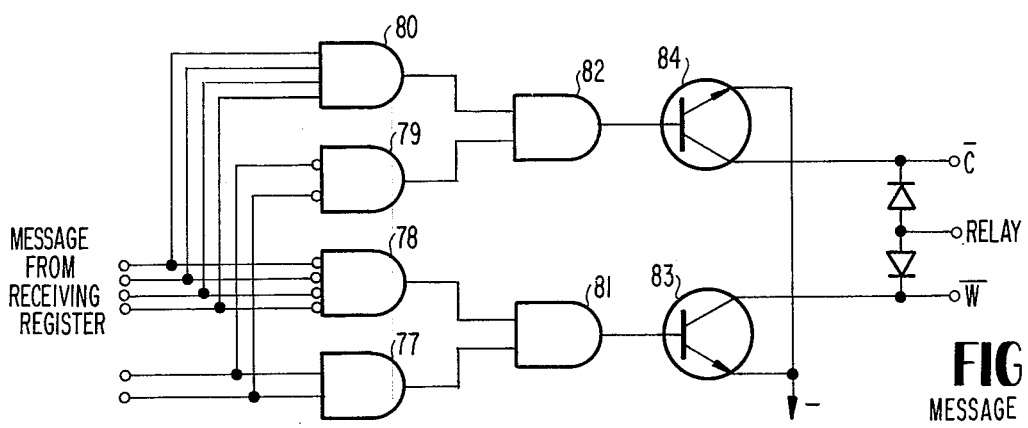
Figure 5B:
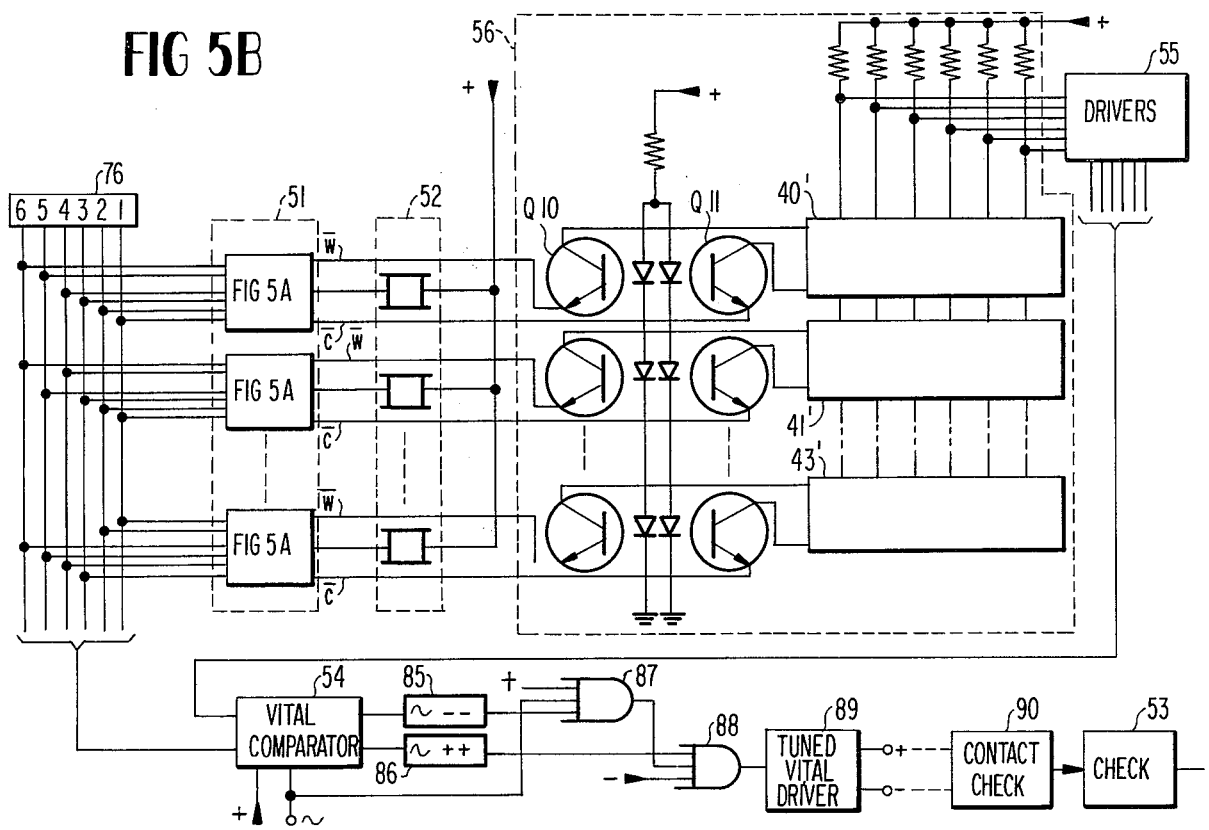

The apparatus to decode a single message is shown in FIG. 5A. This includes six AND gates 77–82, and a pair of transistors 83–84. More particularly, the two one-bit positions for the message to be decoded are connected as inputs to AND gate 77, the four 0 bits in the message to be decoded are connected to AND gate 78, through its inverting inputs. Thus, when the first half of the message which corresponds to the decoder shown in FIG. 5A is received in the register 63 both gates 77 and 78 will produce high outputs producing a high output of gate 81 and enabling transistor 83 providing a low potential at the terminal labelled $\overline{W}$. This potential will remain so long as the register 63 contains the first half of the word. Of course, immediately after the first half of the word is received in the register 60, it was shifted out and the second half of the message is shifted in bit by bit as received. When the second half of the message is completely received, the message store 63 is reset and a new message is inserted therein. At this time, every bit position in the second word should be the complement of every bit position in the first word. As a result, gate 79 and 80 now produce a high output producing a high output of gate 82 enabling transistor 84. Concurrently, of course, transistor 83 is cut off. However, enabling transistor 84 produces a low output at the terminal $\overline{C}$. Thus, a relay connected between a positive source of potential and the terminal marked RELAY is maintained energized throughout the reception of both the first and second words. Of course, if the message included a word that was not decoded by the gates shown in FIG. 5A, the relay would not be energized or remain energized. Those skilled in the art will understand that the apparatus shown in FIG. 5A must be duplicated for each different message which the system is to decode. This is illustrated in FIG. 5B wherein the six outputs of the driver 76 (see FIG. 4) are connected to different decoders in the decoder 51, each identical to the apparatus shown in FIG. 5A, although the connections are varied to decode different messages. Each of the different decoders is connected to a different relay in a group of relays labelled 52. Thus, when the decoder recognizes the first word of a message the corresponding relay is energized by a positive source of potential, through the relay, to the $\overline{W}$ terminal in a decoder. As long as the transistor 83 remains energized, the relay remains energized. When the second word of the message is received, and assuming it is properly decoded, when the transistor 83 becomes non-conductive, transistor 84 becomes conductive and the relay is maintained energized through a circuit including the $\overline{C}$ driver.

If desired, an additional two inputs may be provided to the decoders from the driver 76 stages associated with flip-flops 64, 65 (FIG. 4A). These are connected, with inversion to AND gate 78 and, also with inversion to AND gate 79. As a result the decoder requires the correct alternating 6 bit message words but also the correct non-alternating framing bits.

Also illustrated in FIG. 5B is an exemplary encoder 56, based on the principles disclosed with regard to the encoder shown in FIG. 2. More particularly, a plurality of code panels, one for each valid message, comprising panels 40', 41' and 43', are connected to the outputs of the decoders for the corresponding message. Each of the code panels 40', 41' and 43', is constructed as the corresponding code panel 40, 41 and 43, shown in FIG. 2. It should thus be apparent that when the first word of any message is decoded, the encoder 56 generates the corresponding word and, similarly, when the complement of the first word is received and decoded, the corresponding code panel generates the equivalent bit pattern. The bit pattern generated by one of the code panels is provided to a plurality of drivers 55 and from thence to a vital logic comparator 54. The vital comparator 54 also receives, on another input, the bit pattern provided by the drivers 76 (see FIG. 4A). The vital comparator is also provided with power and an alternating current signal, the reason for which will become clear hereinafter. The vital comparator provides two inputs, one to a vital driver 85 and another to a vital driver 86. The input to vital driver 85 is present if, and only if, the bit pattern presented by driver 76 correspond to the bit pattern presented by drivers 55 (the bit pattern produced by the encoder 56). This is the bit pattern corresponding to the first word of the message. When the second word of the message is decoded the vital comparator produces an input to vital driver 86 if, and only if, the bit pattern provided by driver 76 corresponds to the bit pattern provided by driver 55. Vital driver 85 produces a potential which can be termed "super minus", more negative than any supply potential found in the apparatus. Likewise, the vital driver 86 produces a voltage which can be termed "super positive". The output of vital driver 85 is provided to a vital AND gate 87, along with the alternating current signal and a positive potential. Assuming that the "super negative" potential is also provided to the vital AND gate 87, it produces an output of alternating form which provides one input to vital gate 88. The positive potential may also be provided to AND gate 88 by the output of vital driver 86, and finally, a negative potential may be provided to vital AND gate 88 as indicated. If, and only if, both words of the message are properly decoded, and correspond to the locally encoded patterns will the vital AND gate 88 produce an output, and the output produced will be of alternating current form. This energizes tuned vital driver 89 to provide a potential indicating that the message which has been received has been vitally checked and is correct. After a contact check, to determine that only one of the relays 52 is energized, a check relay 53 is energized which allows the relay output to be provided to the utilization circuits.

FIGS. 7A through 7D illustrated detailed circuits for the vital AND gates such as gates 87 and 88, for the tuned vital driver such as the vital driver 89, for the vital driving producing the super plus, such as driver 86, and the vital driver producing the super negative such as vital driver 85. These circuits are discussed in more detail with regard to their method of operation in my patent applications Ser. Nos. 474,638 and 574,667, filed May 30, 1974 and May 5, 1975, and now U.S. Pat. No. 3,995,173, issued Nov. 30, 1976.

Figure 6:
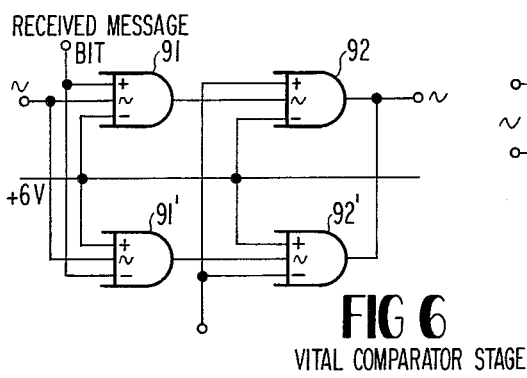
Figure 7C:
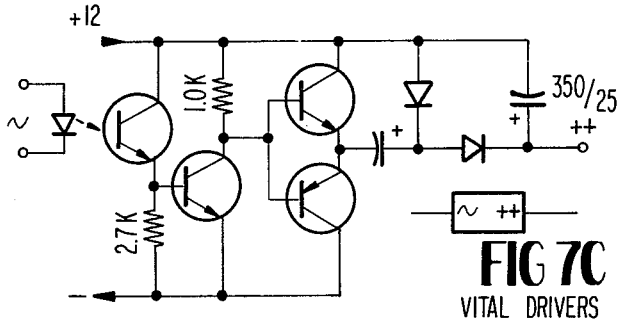
Figure 7B:
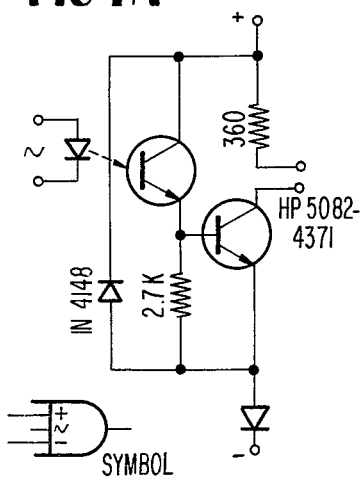
Figure 7B:
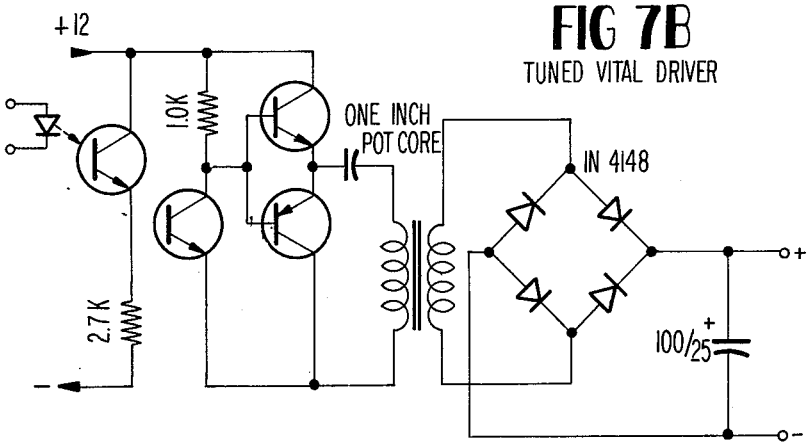

The vital comparator 54 is shown in more detail in FIG. 6.

The vital comparator 54 includes twice as many stages as there are bits in a word; a single stage is illustrated in FIG. 6. This stage includes four vital AND gates (see FIG. 7A). The received message bit corresponding to the stage illustrated is provided, via driver 76 to the positive input terminal of vital AND gate 91 and the negative input terminal of vital AND gate 91'. Source of alternating current is provided as another input to each of the gates 91 and 91', and finally, a positive six volt potential is applied as the negative input to AND gate 91 and the positive input to gate 91'. The output of gate 91 is provided as the alternating current input for gate 92 and the positive six volt potential is applied to the negative input terminal of this gate. The positive input to this gate is provided by the corresponding bit from the locally encoded word from driver 55 which is also provided as the negative input to AND gate 92'. The alternating current input to AND gate 92' is provided by the output of AND gate 91' and the positive input terminal is coupled to the DC level. If the received message bit is a logical one, then gate 91 will be enabled, and, if the corresponding bit from driver 55 is also a one, gate 92 will be enabled and the alternating current output will be available. On the other hand, if the received message bit is a zero, then gate 91' will be enabled, and, if the corresponding bit from driver 55 is also a zero, gate 92' will be enabled also providing the alternating current output signal at the output of this stage. The alternating output current of one stage forms the alternating current input of the next in a chain that has as many stages as bits in a word. If comparison is indicated for each bit in the word then an alternating current output is provided at one of the outputs of the vital comparator. The locally generated complement is provided to a second chain of comparator stages. Each of these stages is provided with the corresponding received message bit. The last comparator stage provides an alternating current output if the message word received is the complement of the first and if the encoder correctly generates the complement. This is the second comparator output, as shown in FIG. 5B. Thus, as word and complement are alternately received and decoded, the local encoder generates corresponding bit patterns. These are detected in the vital comparator which provides alternating inputs to drivers 85 and 86. Only if drivers 85 and 86 are alternately and sequentially energized will the tuned driver 89 produce the output necessary to utilization of the decoded message.

The preceding disclosure of a vital decoder using select/check principles uses many stages of gating in the comparator. This hardware expenditure is justified if the number of messages that are expected is sufficient.

Disclosed hereinafter (see FIG. 10) is a vital logic arrangement for detecting a particular bit pattern followed by its complement. With only one, or several possible messages, it may be worthwhile to consider using the decoder of FIG. 10, providing one for each possible message. On the other hand, if the system includes many messages then the decoder of FIG. 3 will be preferable.

Summarizing some of the vital features of the communication system disclosed, encoder safety is insured by the complementary nature of the words which are shifted through it. Inasmuch as each word shifts through each stage in the shift register, each of the stages are continuously checked for proper operation. The diode arrays generating the word and its complement are distinct from each other so that a failure in one diode array while it will change one word of the message, will not change the second half of the message; thus, preventing decoding of the nowgarbled message.

In the receiver, the use of R-S flip-flops in the store 63 provides a vital check on the circuits that clear this store because if the store is not cleared, the message word and its complement will overlay each other and thus the store will not reflect a valid word which can be decoded. While the decoder, per se, does not perform in any vital manner, its output alone will not serve to operate any utilization circuitry. Rather, the output of the decoder is employed by a local encoder to generate a locally encoded message which should correspond to the received message. A comparison is performed in a vital comparator and only if the vital comparison is detected is the decoding, performed by the non-vital circuitry, acted on. The contact check, functionally indicated at 90 (see FIG. 5B) insures that a double failure does not cause an unsafe condition.

The framing pattern, 1, 0, used in the illustrative embodiment disclosed herein, is, of course, not a necessary ingredient of the invention. Those skilled in the art will readily understand how the opposite framing pattern, 0, 1, could also be employed by simple changes in appropriate circuits. Finally, while the six bit word has also been illustratively shown, those skilled in the art will understand how words of other lengths can be employed. Correspondingly, other 1/0 ratios could also be employed.

The foregoing receiver employs hard-wired apparatus to separately detect the two message words and properly decode them for utilization. The following disclosure will illustrate an embodiment in which a majority of the logic used in the decoding process at the receiver is implemented with a microprocessor.

FIG. 8 illustrates in block diagram form, the microprocessor embodiment for receiving and vitally decoding the serial message encoded as described with regard to FIG. 2. The microprocessor 200 receives the serial message stream on an input thereof, and a receiver clock 201 receives the same message stream. The microprocessor has at least one multi-bit input port, each bit position of which is coupled to an isolator 203. The microprocessor also has at least one multi-bit output port each bit of which is coupled to the same isolator through buffer 202 and diode such as typical diode 212. FIG. 8 illustrates only a typical connection between the microprocessor and isolator along with the associated connection to a typical command relay, such as relay 210; some of the other corresponding relays are shown in dotted line form. A check signal is also available for microprocessor 200, provided, through inverters 208 and 209, to relays 206 and 207 whose contacts 206', and 207' provide a connection path from a tuned vital driver 205 to provide a positive source of potential to pick one of the command relays, such as command relay 210. The tuned vital driver 205 is, in turn, energized by the check logic 204 when the microprocessor provides a proper check word thereto. In normal operation, before an output relay is energized, certain checks are carried out, both on the operating routine of the microprocessor as well as on the hardware of the microprocessor, to determine that no faults or errors have occurred. Once these checks are successfully completed, the command relay corresponding to the decoded message is energized.

As is well known to those skilled in the art, a class of circuitry exists which is termed "vital" to denote that the apparatus is fail-safe. For hard-wired logic systems of a simple kind, the principles in designing vital circuitry are well known, and require that a permissive output not be capable of being developed by a hardware failure. However, when the functions to be performed become complex it is often difficult to apply the well-known principles to be sure that the apparatus is completely fail-safe because it requires a detailed knowledge of the interaction of all the various signals in the apparatus. It is well-known that many, if not all, hard-wired logic functions can be performed by properly programming the central processing unit of a computer, mini-computer or microprocessor. Since a processor user does not have the option of modifying the processor circuitry to insure that a particular output can occur only under proper conditions, such apparatus is not considered vital. One arrangement used in the prior art to provide a vital output from computer apparatus is to employ a pair of computers, and enable a go or permissive signal only if both computers produce identical results. That scheme, although acceptable in theory, leads, of course, to the doubling of hardware utilization. The present invention is concerned with apparatus, including a microprocessor and associated routines, for providing a vital output from the single microprocessor along with associated hardware. The system is arranged around several guiding principles in the use of the microprocessor. Of course, similar principles apply if the microprocessor is replaced by a mini-computer or other computer.

First, don't store anything that can be used against you; meaning that the routine should not require the result producing a go or permissive output to be stored anywhere in the processor. In addition, interrupts and loops are viewed with suspicion. The system should include a variety of accepted safety techniques and the microprocessor should be required to report the completion of major program steps.

As shown in FIG. 8, a receiver clock 201 is provided which also responds to the message stream and provides the processor 200 with an interrupt to accept each bit. If desired, however, clock 201 can be omitted and the microprocessor itself can be programmed to perform this clocking function.

In operation, when a message word has been received, it is decoded by the microprocessor. This operation selects one of the outputs which partially enables the energization of the command relay associated with the output.

Microprocessors are either 8 or 16 bit machines. Each input or output port then contains 8 or 16 bit positions, respectively. If the number of commands to be provided is is seven or less than an eight bit machine with a single input and output port for commands will suffice. Multiplying the number of commands is handled by increasing the number of I/O ports. In this description, we will consider a machine with command requirements satisfied by a single eight bit input and output port.

After the message, or each word, is decoded, several checks are carried out on the microprocessor, however, before the relay is allowed to be energized. The checking process results in production of a check word which is provided as an input to the check logic 204. If the check word produced is the desired check word, the check logic 204 provides an output to the tuned vital driver 205 which is then capable of supplying energy for picking the desired command relay so long as the relays 206 and 207 have been energized. The manner in which these relays are energized will be discussed hereinafter.

Figure 11A:
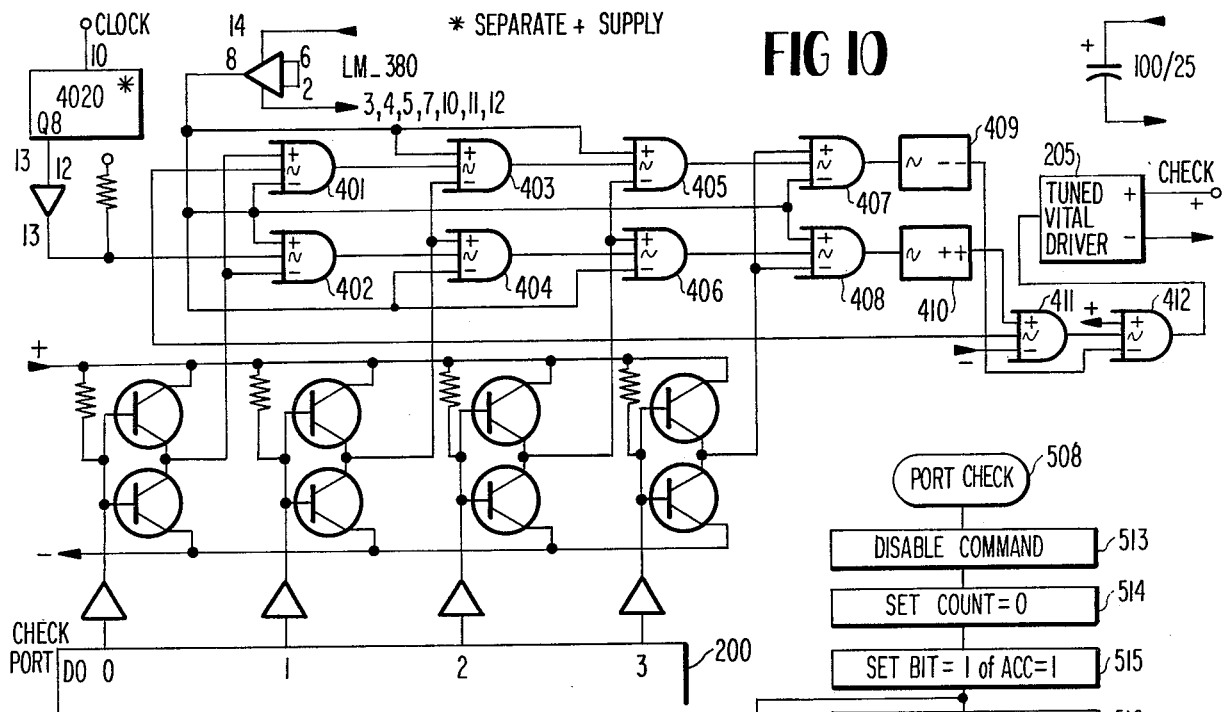
Figure 11A:
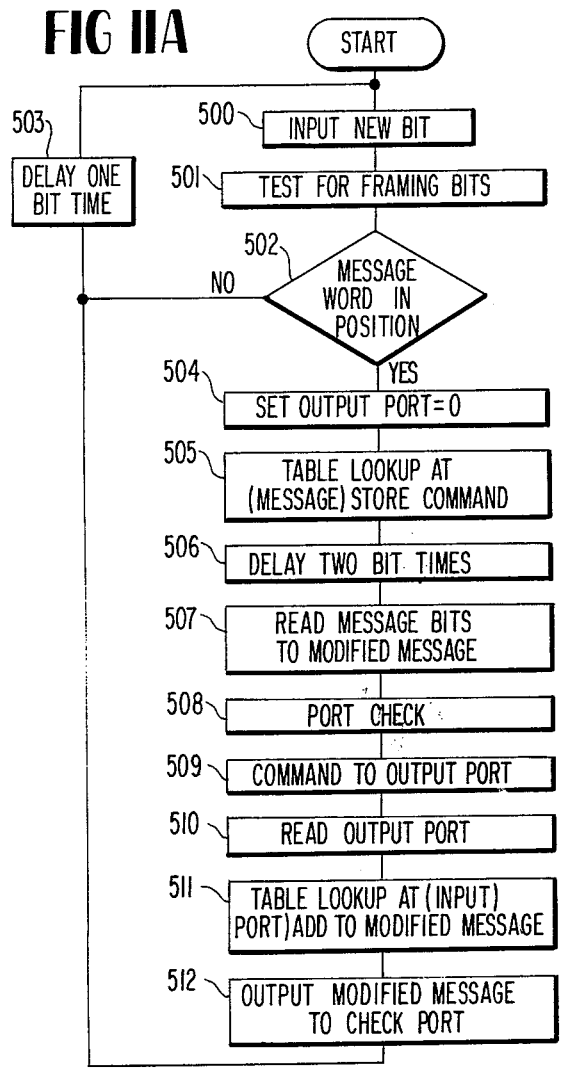

The major steps in the microprocessor routine are as follows:

(1) test framing bits of message for proper pattern, function 501, FIG. 11A (the proper pattern to be tested for is, of course, dependent upon the particular framing bits used in the system);

(2) when the framing bits are detected in the proper locations, clear all registers and output ports, function 504;

(3) perform the output port check routine, function 508;
  (a) deliver one bit to the first bit position of the output port and read output port into input port — (input-output connections increment the set bit) read input port to output port and continue the operation until the set bit reaches the initial bit position. Determine the number of cycles required for this operation.
  (b) modify the received message and add to the modified message the number of cycles required to complete the port check.

(4) use the unmodified input word as an address and enter a table. Send the table output to the output port, functions 505, 509;

(5) read the output port (due to the output-input wiring this results in a left shift), function 510;

(6) enter a second table with the word now at the input and add the second table output to the modified message word and deliver the sum to the check output port (the second table contents are arranged so that all message words produce the same check word and all message complement words produce the complement of the check word), functions 511, 512.

The check word is validated by the check logic circuit 204; validation enables power for the command relay, coupled with selection of the command output energizes the selected relay.

Figure 11B:
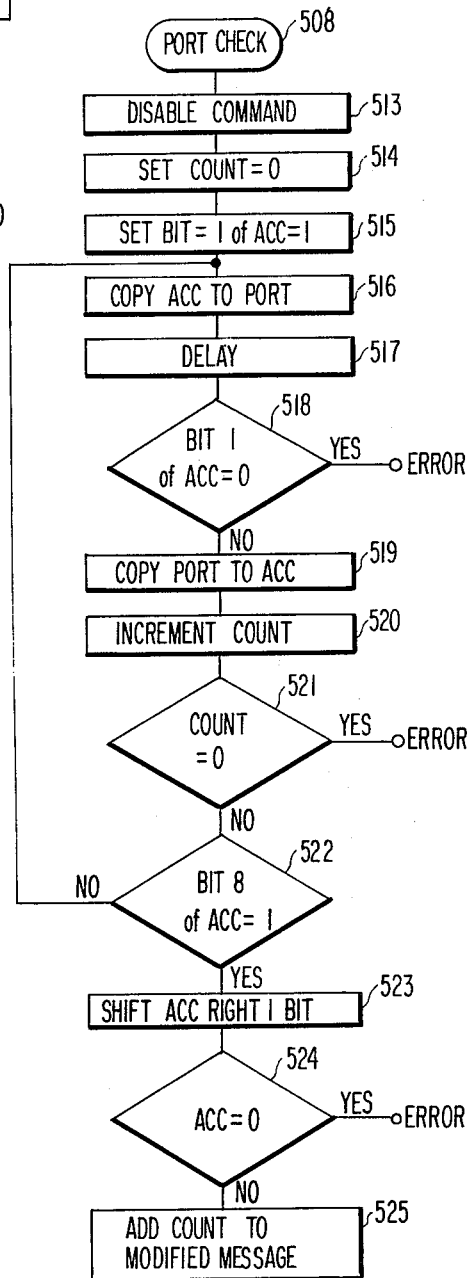

The overall routine is illustrated in FIG. 11A, and the port check routine is illustrated in FIG. 11B.

The isolator 203 is illustrated in more detail in FIG. 9. As part of the checking procedure, the system will check the microprocessor's I/O to see that it is actually under control of the microprocessor. To effect this, the output is wired to the input through an isolator 203 with a left shift, that is, output port, bit 1, is wired to input port, bit 2. To enable the port check, therefore, a bit is loaded into the first bit position of an output port, for example. The input is then read, and the bit should show up in bit 2. This operation is repeated for the number of times equal to the number of bit positions in the I/O port, wherein the bit should end up where it began. Microprocessor, therefore, loops through this input reading and transfers the input to the output and determines how many cycles it takes for the bit to travel back to the initial position. Rather than storing the result and comparing the count to the stored result, the stored result itself is added in as a factor (function 525) in the routine.

To determine that the microprocessor is operating properly, the routine of FIG. 11A includes a step, functions 506-507, to modify the stored message word. Actually, this could be any arithmetic modification. Illustrated in FIG. 11A, however, is an arithmetic modification in which the eight bit message FFXXXXXX (where X represents a word bit position and F represents a framing bit) is modified by two left shifts and using the following framing bits to fill the eight bits, resulting in XXXXXXFF. Added to this modified message is the cycle count from the port check subroutine, function 525. This value is then one factor used in computing the check output. The isolator, therefore, has a number of outputs equal to the number of bits in an input port, and each is coupled to the output of OR gate 217. One input to the OR gate 217 comes from the collector of a transistor 216 which is supplied with power from its own power source through a suitable resistance. The transistor 216, in turn, is optically coupled to a light-emitting diode 215. The light-emitting diode 215, in turn, receives an input from a bit position in the output port, shifted once to the right with regard to the input port bit position. Thus, output port bit 1 is coupled to an LED 215 which is optically coupled to a transistor 216 which is associated with input port bit 2.

To further check that the output port is being controlled, the apparent command output is loaded into the output (function 509) and then the input is read. Under normal circumstances, this should be the output command shifted left once. This is then used as an address in a table (function 501) and the result is added to the modified message. The result is the check word output through the check port. With proper selection of table values the check word will be 0110 (for each first message word) and 1001 (for each second message word). Since neither check word is stored anywhere in the machine, it can only be generated by correct operation of the hardware and software in the system. The various checks verify proper operation of the input (function 507), the port check (function 508) check that the output ports each operate and are under control of the microprocessor and functions 509, 510 check that the output port has properly responded to the command. Of course, the microprocessor, at function 512, produces an eight bit result. The least significant four bits can be used as the check word, or the eight bits can be arithmetically or logically combined in a chosen manner to produce a four bit result.

Figure 10:
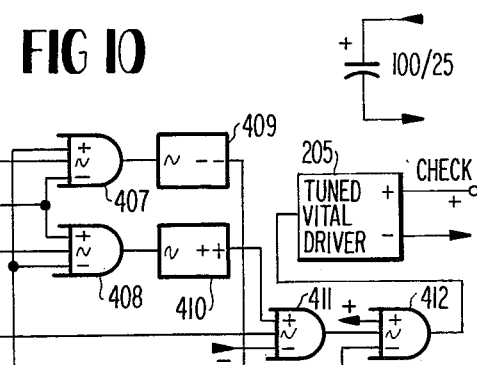

FIG. 10 illustrates the check logic. As was explained above, at the conclusion of the routine, in addition to decoding the received message, and determining the identity of a particular command relay which is to be energized, the routine also produces a check word, or accurately, a pair of check words, one for each word in the message. Since the message is comprised of words which are complements, the check words are also complements. Although the check words can have an arbitrary length, it is preferably more than two bits long and four bits are chosen here as exemplary. The check word is delivered to a check port in the microprocessor 200. Each bit in the check word is coupled, via suitable buffers, to the check logic, per se, made up of two vital AND gates for each bit, for example, AND gates 401–408. The first pair of AND gates in the logic, 401, and 402, receive their dynamic input signals as received from the clock. The other inputs of these gates are wired complementary, that is, the positive input of AND gate 401 and the negative input of AND gate 402 are wired to the output of one bit position of the driver. The negative input of gate 401 and the positive input of gate 402 are tied to a suitable constant potential input. As a result, if the bit position to which the gates are wired produces a positive output, gate 401 will be enabled, whereas, if the bit position produces a negative output, gate 402 will be enabled. Gate 407 is wired as gate 401 and gate 408 is wired as gate 402. Gates 402 and 405 are wired complementary to gate 401 and gates 404 and 406 are wired complementary to gates 402. As a result, if the word produced at the check port is 0110, gates 402, 404, 406 and 408 will be enabled. If any of the bits in the word are different from the pattern 0110, then gate 408 will not produce an alternating current output. Likewise, when the check word is 1001 gates 401, 403, 405 and 407 will be enabled producing an alternating current output. Again, if a pattern is not exactly 1001, then gate 407 will not produce an alternating current output. Assuming, however, these patterns are alternately presented to the logic, first driver 409 will be energized then driver 410 will be energized, alternately and in sequence. A final pair of gates 411 and 412 are coupled to the outputs of the drivers 409 and 410, and gate 411 has an alternating current input provided by the clock. Thus, when driver 410 is enabled gate 411 will produce an alternating current output. In a similar fashion, when driver 409 is enabled gate 412 will be enabled. Although drivers 409 and 410 operate alternately and in sequence, their capacitive outputs retain the voltages that they produce for a sufficiently long time, so that if the alternating sequence is continued, the gates 411 and 412 will both be enabled to pass the AC signal to the input of the tuned vital driver 205, which will result in producing the check voltage required. Failure to produce the check bit patterns alternately and in sequence, will result in removal of the output voltage from the tuned vital driver 205.

In the illustrated embodiment a specific example of the principles enumerated at the beginning of this description are included. Several checks are included, both on the proper program steps as well as on the hardware of the microprocessor. For example, the character of the message, including the word and its complement, necessarily subjects the hardware to a dynamic cycle check by time-sharing the channel among signals of different amplitudes. Since a permissive output which is merely a 1 or a 0, may be too easily produced by spurious means, a multi-bit pattern and its complement are used to produce the permissive signal, and this pattern must be repeated continuously, requiring a closed circuit type operation, in order to produce the permissive signal. Each of the bits in the alternating pattern is produced by successful completion of major program steps and since none of them are stored anywhere in the processor, the routine must be completed. The checking pattern, including four bits and their complements, outputed through the same four hardware stages, provide a dynamic cycle check on the output and associated hardware.

The microprocessor itself can comprise any of a variety of commercially available microprocessors, such as the National SC/MP. In general, any eight bit microprocessor having one interrupt input, one jump input, two flag outputs, a four bit parallel output port for the check word, and parallel output and input ports for providing one bit for each message to be decoded. This assumes that a relay is to be driven by each message. If some messages to be decoded are not to result in driving a relay the I/O requirements can be relaxed.

What is claimed is:

1. Vital digital communication system responsive to the selection of a desired command to be sent for encoding a corresponding message, transmitting and decoding the message to derive said command in a vital manner comprising:

a transmitter including encoding means responsive to the selection of a desired command for generating and outputting said message, said message comprising a pair of multi-bit words, each word separated from other words by an identical multi-bit framing sequence, a second word of said pair complementary to a first word of said pair, the ratio of ones and zeroes in either said first or second word being constant, a receiver including vital decoding means responsive to the output of said encoder for identifying said framing bits and for identifying each word of said message, said vital decoding means including, means for sequentially producing multi-bit words in response to sequential receipt of said encoded words and means for checking that said sequentially produced multi-bit words are complementary to each other, said last-named means including, a multi-bit comparator for comparing said produced multi-bit word with a multi-bit pattern, said comparator sequentially emitting different outputs if sequential ones of said produced multi-bit words are complementary, said vital decoding means providing an output indicative of said command if, and only if, said sequentially emitted outputs are provided.

2. The apparatus of claim 1 wherein said encoding means includes a clock shift register loading means, a shift register coupled to said clock, said shift register responding to said shift register loading means for alternately storing in said shift register a pair of framing bits and an encoded word or its complement, said shift register outputting said message in response to said clock.

3. The apparatus of claim 2 in which said shift register loading means includes a plurality of bit pattern producing means, each corresponding to a different message that can be sent, a different one of said bit pattern producing means enabled by said selection of a desired command.

4. The apparatus of claim 3 in which each of said bit pattern producing means includes a coupling means coupling a selected potential to a word or complement terminal for each bit in said bit pattern, word and complement switching means responsive to said clock for alternately coupling said word or complement terminals to a different selected potential to generate a bit pattern or its complement in response to said clock at terminals of said coupling means.

5. The apparatus of claim 1 wherein said vital decoding means includes, a register for sequentially storing sequentially received words, combining means for combining various bit positions outputs of said register in selected combinations for identifying an apparent message, said means for sequentially producing multi-bit words in response to receipt of said encoded words including encoding means responsive to said apparent message for locally generating a bit pattern corresponding to said apparent message, said produced word compared by said multi-bit comparator comprising said received word and said multi-bit pattern with which said produced word is compared comprising said locally generated bit pattern.

6. The apparatus of claim 1 wherein said vital decoding means includes a register for sequentially storing received words, a decoding panel for each possible message, each said panel including two series of serially connected gates, each of said gates in a series connected to a different stage of said register, the connections of corresponding gates, in each series, to said register being complementary, and output means connected to an output of a last gate of each series of gates for providing a distinctive output if a message word and its complement are alternately stored in said register.

7. The apparatus of claim 1 wherein said vital decoding means includes a single central processor unit responsive to said message for producing an output distinctive of said message, and wherein said multi-bit comparator compares said produced multi-bit word comprising a check word provided by said central processing unit to validate the operations thereof.

8. The apparatus of claim 7 wherein said central processor unit includes:

first checking means to check operation of at least one output port of said central processor unit, said first checking means producing a quantity, said central processor unit employing said quantity in deriving said check word.

9. The apparatus of claim 7 in which said central processor unit includes, means responsive to a received message word for modifying said word in a predetermined fashion and for using said modified message word in deriving said check word.

10. The apparatus of claim 7 in which said central processor unit includes:

means for decoding said message and writing a signal distinctive thereof in an output port, input means responsive to said signal in said output port for accessing a table and deriving a quantity therefrom, and means employing said quantity in deriving said check word.

11. The apparatus of claim 7 in which said central processor unit includes:

first checking means to check operation of at least one port of said central processor unit, said first checking means producing a first quantity, means responsive to a received message word for modifying said word in a predetermined fashion to produce a modified message word, means for decoding said message and writing a signal distinctive thereof in an output port, input means responsive to said signal in said output port for accessing a table and deriving a second quantity therefrom, second checking means producing said check word as the sum of said first quantity, said modified message and said second quantity.

12. A vital decoder for a digital communication system in which one multi-bit message of a plurality of messages is repetitively transmitted in serial form, said multi-bit message including two words, a second complementary to a first, each word having a constant ratio of 1's to 0's and words separated by an identical multi-bit framing pattern, said decoder comprising:

register means into which a received message is clocked, bit by bit, frame detector means coupled to said register means, a storage register also coupled to said register means and controlled by said frame detector means for storage of a message word, apparent message determining means responsive to said storage register and coupled to output means, for generating an apparent message, encoding means responsive to said apparent message determining means for generating a locally encoded message corresponding to said apparent message, and vital logic means responsive to both said storage register and to said apparent message for enabling said output means, said vital logic means including a multi-bit comparator comparing received words from said storage register and corresponding words from said encoding means and producing two distinctive sequential outputs if said words are identical, said vital logic means enabling said output means if, and only if, said multi-bit comparator produces said two distinctive outputs, alternately and in sequence.

13. The apparatus of claim 12 further including a pair of voltage generators producing potentials greater in absolute value than any supply potential in response to one or another of said distinctive outputs of said multi-bit comparator, said multi-bit comparator is coupled to both said vital driving means, each said vital driving means producing said potential responsive to the corresponding multi-bit comparator output, each said vital driving means having a capacitively coupled output.

14. The apparatus of claim 13 in which each said vital driving means is coupled to further logic means producing a distinctive signal if, and only if, both said vital driving means produce said DC potentials, said distinctive signal enabling said output means.

15. A vital decoder for a digital message which digital message includes a pair of multi-bit words separated from other words by a predetermined multi-bit framing sequence, a second word of said message complementary to a first word, said decoder including a single central processing means, said central processing means including:

means responsive to said framing sequence for identifying each multi-bit word;

means responsive to each said multi-bit word for determining a command represented thereby;

checking means for checking control of said central processing means over its own output ports, said checking means producing one of two distinctive multi-bit words in response to completion of said checking after receipt of each said message word, said distinctive multi-bit words being complementary if said message words are valid and said checks are favorable, said decoder further including;

logic means responsive to said distinctive multi-bit words for validating operation of said central processing means, said logic means including a multi-bit comparator for comparing said distinctive words to predetermined bit patterns and validating said operation if, and only if, said distinctive words are produced alternately and in sequence, and means responsive to validation by said logic means for enabling utilization of a command provided by said central processing means.

16. The apparatus of claim 15 which further includes isolation means coupling outputs of said central processing means to inputs thereof, said outputs coupled through said isolation means to said inputs with a right shift said checking means setting the lowest order output bit, and cyclically reading output to input and writing input to output until the lowest order output is again set, said checking means further recording the number of cycles employed and using said number in producing said distinctive multi-bit words.

17. The apparatus of claim 15 in which said central processing means modifies each multibit word, derives, from a table, a numerical quantity corresponding to said modified multibit word, and uses said numerical quantity in producing said distinctive multibit word.

18. The apparatus of claim 15 in which said central processing means writes a digital version of said command to several bit outputs, reads in a modified version thereof, employs said modified version, with a table, to derive a numerical quantity used to produce said distinctive multibit word.

* * * * *